United States Patent
Artaki et al.

(12) 
(10) Patent No.: US 6,276,593 B1
(45) Date of Patent: Aug. 21, 2001

(54) APPARATUS AND METHOD FOR SOLDER ATTACHMENT OF HIGH POWERED TRANSISTORS TO BASE HEATSINK

(75) Inventors: Iris A. Artaki, Furlong, PA (US); Nagesh Ramamoorthy Basavanhally, Trenton, NJ (US); Scott Allen Bergman, Groveport, OH (US); George Michael Wenger, Somerset, NJ (US); Walter J. Picot, Boonton Township, NJ (US); Marsha M. Regn, Hamilton Square, NJ (US); Girard Sidone, Hamilton Township, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/351,220

(22) Filed: Jul. 12, 1999

(51) Int. Cl.⁷ .............................. B23K 31/02; H01L 21/48
(52) U.S. Cl. ...................... 228/180.21; 228/182; 228/254
(58) Field of Search ............................ 228/180.21, 180.1, 228/179.1, 165, 182, 254; 257/276, 675, 706, 717; 438/122

(56) References Cited

U.S. PATENT DOCUMENTS

| | | | |
|---|---|---|---|
| 4,684,055 | * | 8/1987 | Baer et al. . |
| 4,734,818 | * | 3/1988 | Hernandez et al. . |
| 4,769,525 | * | 9/1988 | Leatham . |
| 4,801,069 | * | 1/1989 | Ankrom et al. . |
| 5,046,957 | * | 9/1991 | Millhimes . |
| 5,161,729 | * | 11/1992 | Dunaway et al. . |
| 5,170,931 | * | 12/1992 | Desai et al. . |
| 5,271,548 | * | 12/1993 | Maiwald . |
| 5,281,301 | * | 1/1994 | Basavanhally . |
| 5,450,284 | | 9/1995 | Wekell .................................. 361/710 |
| 5,612,512 | * | 3/1997 | Wakamatsu et al. . |
| 5,884,396 | * | 3/1999 | Lin . |
| 6,011,693 | * | 1/2000 | Gore . |
| 6,119,920 | * | 9/2000 | Guthrie et al. . |
| 6,162,661 | * | 12/2000 | Link . |

* cited by examiner

Primary Examiner—Tom Dunn
Assistant Examiner—Jonathan Johnson
(74) Attorney, Agent, or Firm—Duane, Morris & Heckscher LLP

(57) ABSTRACT

A printed wiring board assembly is formed by mounting an insert having a pocket containing one or more standoffs in the cavity of a pallet. The pallet and the insert are both coupled to the bottom of a printed wiring board. A device having tinned leads and a tinned casing is positioned in the pocket of the insert above the standoffs. A solder preform is positioned in the pocket of insert, beneath the casing of the device. The assembly is placed in a soldering oven and heated to a at least a reflow temperature of the solder preform, whereby the device casing is joined to the insert and the device leads are coupled to solder pads on the printed wiring board.

23 Claims, 3 Drawing Sheets

APPARATUS AND METHOD FOR SOLDER ATTACHMENT OF HIGH POWERED TRANSISTORS TO BASE HEATSINK

FIELD OF THE INVENTION

This invention concerns apparatus and methods for forming printed wiring board assemblies.

DESCRIPTION OF THE RELATED ART

Solid-state circuits typically include transistors that are mounted to printed wiring board (PWB) assemblies. In a typical configuration, a PWB assembly is formed by bonding a pallet to the bottom surface of a printed wiring board. The pallet supports the PWB and acts as a heat sink to draw heat from the transistors and related componentry.

FIG. 1 shows a conventional assembly 5 in exploded isometric view. The assembly includes a pallet 14 that is bonded to the bottom surface of a printed wiring board (PWB). The PWB includes an opening 17 that is aligned with a corresponding pocket 15 formed in the pallet 14. The pocket 15 is shaped to receive a transistor 18. The transistor 18 is positioned in the pocket 15 and protrudes through the opening in the PWB 16. The transistor leads 21 are connected to the PWB and the bottom of the transistor casing is directly to the pallet 15.

The integrity of the solder joints formed between the transistor casing and the pallet 14, and between the transistor leads 21 and the PWB 16 are critical to the successful operation of the assembly. Several factors are known to negatively impact the quality of the solder joints, and to thus shorten the operating life of the assembly.

One factor contributing to the premature failure of the transistor/pallet solder joint is the mismatched coefficients of thermal expansion (CTEs) between the transistor and the pallet 14. Pallets formed of aluminum or magnesium are often preferred because they are lightweight and inexpensive to produce. However, the CTEs of these materials differ substantially from the CTEs of transistors commonly used in PWB assemblies. For example, the CTEs of high powered RF transistors, often used in used in amplifier circuits for wireless equipment, are roughly two times the CTE of aluminum.

Variations in solder joint thickness can also contribute to premature failure of the pallet/transistor solder joint, and the transistor lead/PWB solder joints. In one known method of assembly, a solder preform is placed between the transistor casing and a corresponding pallet. The transistor is pressed against the preform and pallet, as the solder is reflowed to join the components. Uneven load distribution on the transistor often causes the solder to be squeezed out from between the joined surfaces in an uneven fashion during reflow soldering. As a result, the solder joints between the transistor and the pallet, and between the transistor leads and the PWB are weakened and transistor performance is compromised.

Production levels for amplifier circuits are also limited using the above-described methods of assembly. In accordance with the described methods, each transistor must be individually positioned on a corresponding pallet and the leads and base of each transistor must be soldered or otherwise connected to the PWB assembly. Transistor leads can become misaligned (both horizontally and vertically) with respect to solder pads as the solder preform is reflowed to join the transistor casing to the pallet, requiring costly and time consuming rework of the assemblies.

Accordingly, there is a need for improved constructions and methods for forming PWB assemblies.

SUMMARY OF THE INVENTION

The invention provides a method for forming a printed wiring board assembly. In accordance with the invention, an insert is provided having a pocket containing one or more standoffs for supporting a device above the bottom surface of the pocket. The insert is mounted in the cavity of a pallet. A device, such as a transistor, having tinned leads and a tinned casing, is positioned in the pocket of the insert above the standoffs. The leads of the device are soldered to a printed wiring board, and the casing of the device is soldered to the pocket.

BRIEF DESCRIPTION OF THE DRAWINGS

These and other features and advantages of the invention are more fully disclosed or rendered apparent from the following description of certain preferred embodiments of the invention, that are to be considered together with the accompanying drawings wherein like numbers refer to like parts and further wherein.

DETAILED DESCRIPTION

Figure 1:
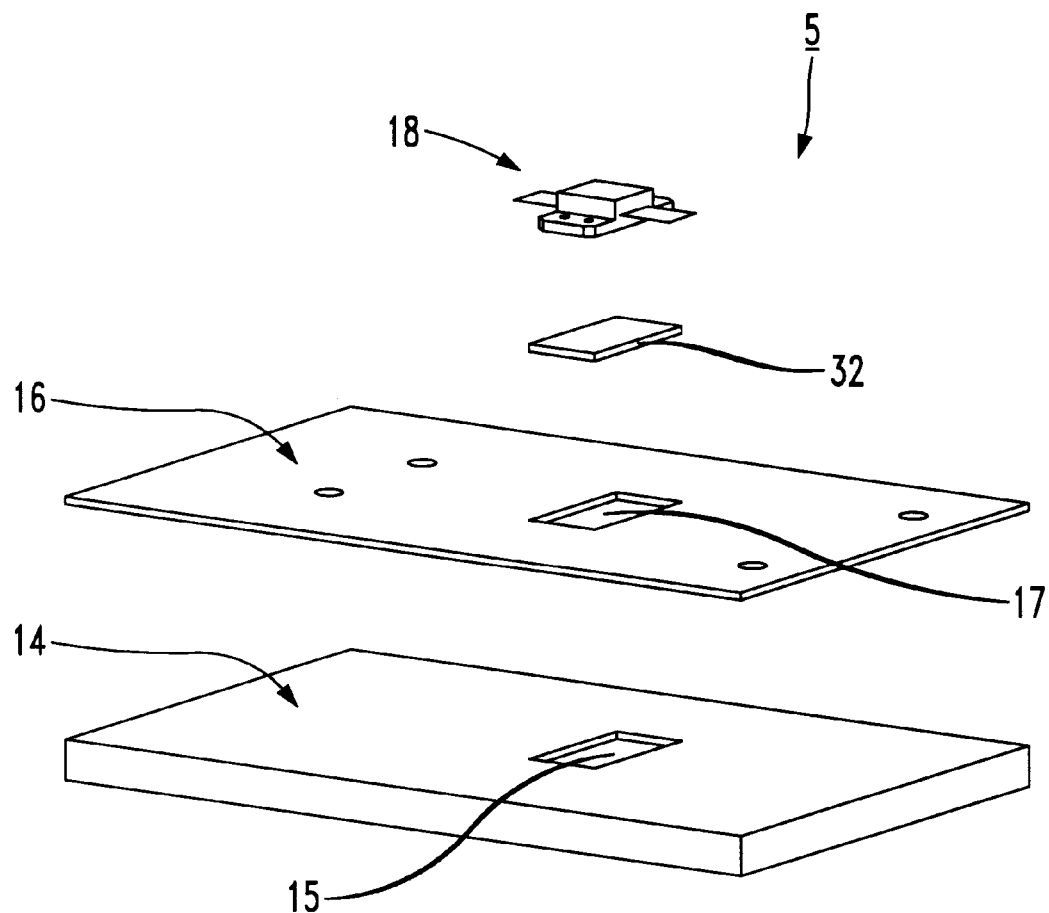
FIG. 1 is an exploded isometric view of a printed wiring board assembly according to the prior art.
Figure 2:
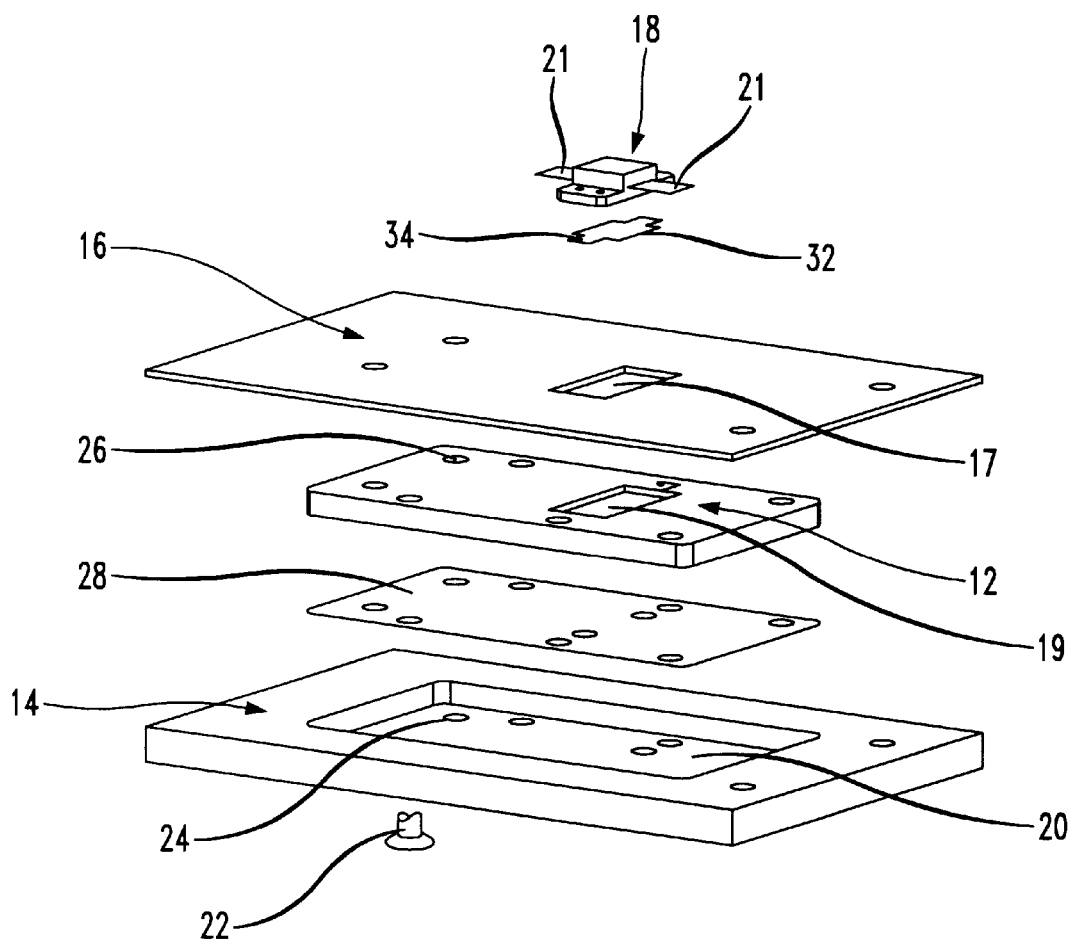
FIG. 2 is an exploded isometric view of a printed wiring board assembly including a metal insert mounted in a cavity formed in the surface of a pallet according to the invention.
Figure 3:
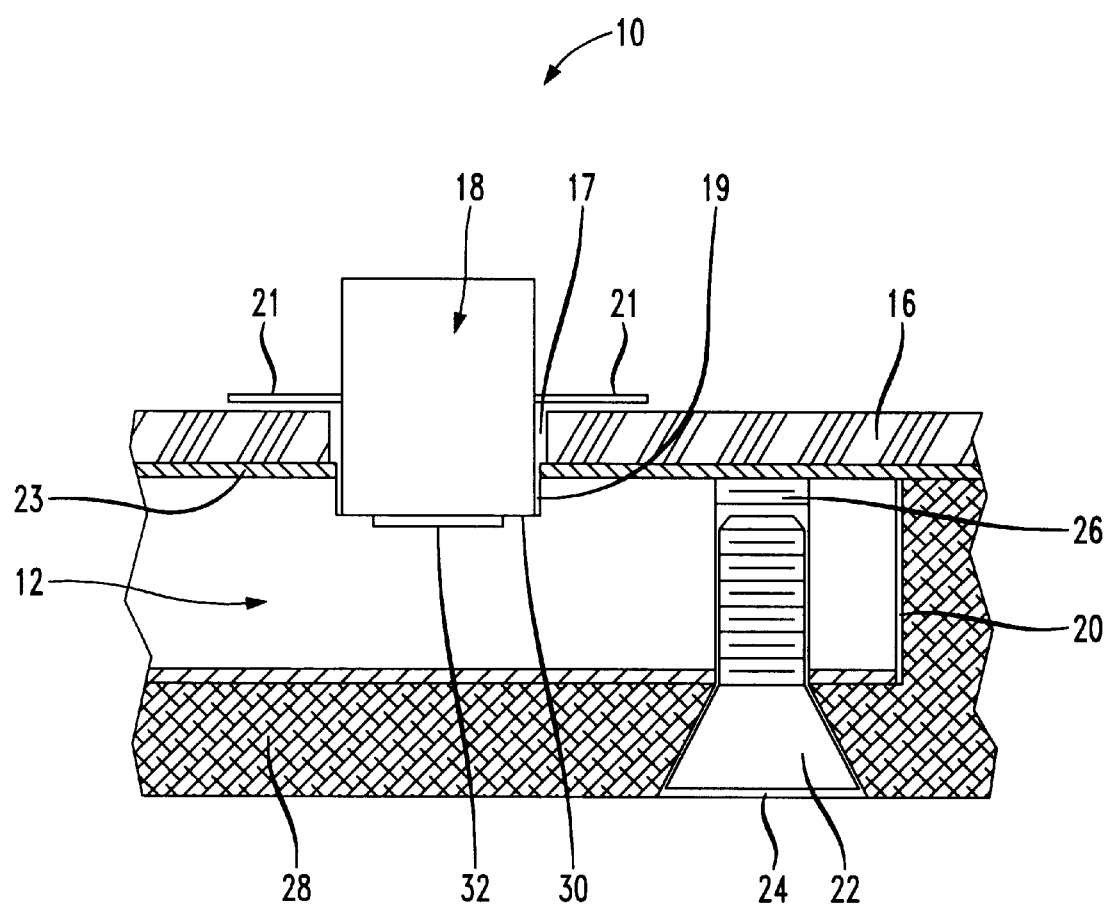
FIG. 3 is a cross-sectional elevation view of the PWB assembly shown in FIG. 2.

Referring to FIGS. 2 and 3, a PWB assembly 10 in accordance with the invention includes an insert 12 mounted to a pallet 14. The insert 12 and the pallet 14 are both bonded to the bottom surface of a printed wiring board (PWB) 16 with solder or adhesive 23. The PWB 16 includes an opening 17 that is aligned with a corresponding pocket 19 formed in the insert 12. The pocket 19 is shaped to receive an electronic component that, in the embodiment shown, consists of a high-powered RF transistor 18. The transistor 18 is positioned in the pocket 19 and protrudes through the opening in the PWB 16. The transistor leads 21 are connected to the PWB and the bottom of the transistor casing is soldered to the insert 12.

More particularly, pallet 14 includes a cavity 20 having a substantially rectangular cross-section. The cavity is located on a top surface of the pallet 20 and is sized to receive insert 12. Mechanical fasteners 22 are used to secure the insert 12 in the cavity of the pallet 14. The fasteners 22 extend through vertical bores 24 provided in the pallet 14 and are received by threaded holes 26 provided in the insert 12. The fasteners 22 may be screws or other equivalent fasteners known in the art. The pallet 14 can be formed of any material having suitable thermal and electrical properties and is preferably formed of aluminum.

Insert 12 may be formed of any electrically conductive and solderable material and preferably is formed of metal. Insert 12 has a profile which is complementary to cavity 20 provided in pallet 14. A pocket 19 is provided on the top surface of insert 12 and is shaped to receive a transistor 18. The pocket 19 may include one or more standoffs or lands 30 which support the transistor 18 in a predetermined position above the bottom surface of the pocket 19. The standoffs 30 define both the thickness of the solder joint between the insert 12 and the transistor 18, and the thickness of the solder joint between the transistor leads 21 and the PWB 16. The standoffs 30 prevent the solder 23 from being squeezed out from between the transistor 18 and the bottom of the pocket 19 during soldering of the transistor to the insert 12, thus ensuring that a uniform solder thickness is maintained between the casing of the transistor 18 and the pocket 19. Experimental tests have shown that good solder joint performance and integrity are achieved using a uniform solder thickness of at least about 0.006 inches between transistor 18 and insert 12, and preferably about 0.010 inches, and using a solder thickness of between about 0.004 and about 0.015 inches between the transistor leads 21 and the PWB 16. Thus, the standoff height should be selected to provide solder joint thicknesses in these respective ranges.

In a preferred embodiment, four standoffs 30 are utilized, one at each corner of the pocket 19. By locating the standoffs 30 at the periphery of the transistor 18, the solder joint surface area can be maximized at the center of the transistor bottom, where the heat generated by the transistor tends be the greatest. This arrangement optimizes heat transfer between the transistor 18 and the metal insert 12. It will be appreciated by those skilled in the art, that the location, size and number of standoffs provided in the metal insert 12 may be varied to suit a particular application or mounting component.

The solder preform 32 is shaped to fit in the pocket 19 of the insert with standoffs 30 projecting through cutouts or apertures 34 provided in the preform. The apertures 34 prevent the top of standoffs 30 from being covered with solder paste, thereby reducing the incidents of shorting between the transistor casing and the transistor leads 21.

The metal insert 12 can be formed of any material having suitable properties of thermal conductivity and diffusivity and coefficient of thermal expansion (CTE). Preferably, the CTE of the metal insert 12 should approximate the CTE of the transistor 18 to maximize the integrity of the solder joint provided therebetween. Tests have shown that good solder joint performance is achieved when the respective CTEs of metal insert and the transistor are within 10 percent of one another. In a preferred embodiment, the metal insert 12 is formed of copper, and both the insert 12 and the pallet 14 are plated with gold to reduce incidents of galvanic corrosion.

A thermally and electrically conductive pad 28 is disposed between the bottom of metal insert 12 and pallet 14. The pad 28 may be approximately 0.003 inches to 0.004 inches in thickness and is formed of cloth which is impregnated with metal. The pad 28 acts as a thermal interface between the insert 12 and pallet 14, filling voids that result from poor contact between the mating surfaces, thus improving heat conduction between the surfaces. The thermal pad 28 may alternatively be formed of metal impregnated epoxy, thin sheets of metal or a layer of thermal grease.

In an alternative embodiment, the insert 12 may be eliminated from the PWB assembly, and the pocket 19 including standoffs 30 may be formed directly in the pallet 14.

A PWB assembly in accordance with the invention is formed as follows. A thermal pad 28 is placed in the cavity 20 of pallet 14. Thereafter, a corresponding metal insert 12 is inserted in the cavity and secured to the pallet 14 using a plurality of fasteners 22. As the fasteners 22 are tightened, the thermal pad 28 is sandwiched between the insert 12 and the pallet 14. The thermal pad 28 conforms to the mating surfaces of the insert 12 and pallet 14, thereby eliminating any air gaps or voids between the surfaces.

After the insert 12 and pallet 22 are assembled, the PWB 16 is positioned on the pallet/insert sub-assembly so that the opening provided in the PWB 16 is aligned with the pocket provided in insert 12. Next, the top surfaces of the insert 12 and pallet 14 are simultaneously bonded to the bottom surface of the corresponding PWB 16. Bonding of the PWB to the pallet/insert subassembly is achieved at elevated temperatures using either solder or adhesive, and employing techniques commonly known to those skilled in the art. The bonding process serves to structurally and electrically connect the PWB 16 to the pallet 14 and insert 12.

Once the PWB subassembly is formed, a transistor 18 or another electronic component can be mounted to the assembly. Before installing the transistor 18, a solder preform 32 is placed in the pocket 19 formed in the insert 12. The transistor 18 is then placed in the pocket 19 of the insert 12 on top of the solder preform 23 and positioned on the standoffs 30 so that the transistor leads are aligned with corresponding solder pads on the PWB 16. Transistor leads 21 are straightened, prior to assembly, with a stamping die (not shown) to improve lead height tolerances. The transistor 18 is pressed against the solder preform 23, using known fixture devices, as transistor leads 21 are connected to the PWB 16 and as the solder preform 23 is reflowed in order to join the transistor 18 to the insert 12. Both the transistor casing and the transistor leads 21 are tinned to avoid potential embrittlement of the solder joint.

A number of advantages are achieved according to the subject invention. Soldering the casings of transistors 18 to copper inserts 12, rather than directly to aluminum or magnesium pallets 14, provides a number of performance advantages. In the case of high-powered RF transistors 18, soldering the transistor casings to the inserts 12 has resulted in significant improvements in both thermal and RF performance. Additionally, soldering transistor casings to metal inserts 12 having closely matched CTEs has been shown to markedly extend the life of the solder joint as compared to prior known constructions. Standoffs 30 provided in the pocket 19 of the metal insert 12 ensure accurate positioning of transistor leads 21 with respect to the PWB 16, and provide for a uniform thickness of the transistor/insert solder joint and the transistor lead/PWB solder joints. These attributes further enhance both the solder joint reliability and transistor performance.

A PWB assembly in accordance with the invention is particularly suited for an automated production environment. The use of standoffs provided in the pockets of the inserts combined with tight tolerances required for both the pallet assembly and the transistor leads, ensure accurate positioning of transistors and transistor leads with respect to PWBs. By eliminating the need for manual manipulation and positioning of individual transistors, the assembly process can be automated. Robotic arms may be used to position transistors and corresponding transistor leads on pallet assemblies in a quick, accurate and repeatable manner. Pallet assemblies containing transistors may then be placed in soldering ovens to simultaneously solder the transistor casings and transistor leads to PWB assemblies. Accordingly, the described methods and constructions allow hundreds of transistors to be simultaneously mounted to PWB assemblies in a reliable and efficient manner.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. A method for fabricating a printed wiring board (PWB) assembly comprising the steps of:

mounting an insert in a cavity on a pallet, the insert having a pocket including at least one standoff for supporting a device above the bottom surface of the pocket;

positioning the device above the at least one standoff, the device having tinned leads and a tinned casing;

soldering the device leads to soldering pads on a PWB; and soldering the casing of the device to the pocket of the insert.

2. The method of claim 1 wherein the steps of soldering the device leads to soldering pads, and soldering the casing of the device to the pocket of the insert are automated.

3. The method of claim 1 wherein the steps of soldering the device leads to soldering pads, and soldering the casing of the device to the pocket of the insert are performed simultaneously.

4. The method of claim 1 further comprising the step of placing a solder preform in the pocket of the insert.

5. The method of claim 4 wherein the step of soldering the casing of the device to the pocket of the insert comprises heating the PWB assembly to at least a temperature necessary to reflow the solder preform.

6. The method of claim 4 wherein the solder preform includes cutouts that are complementary to the at least one standoff and the at least one standoff projects through the cutouts when the solder preform is positioned in the pocket of the insert.

7. The method of claim 1 further comprising the step of placing a thermal pad in the cavity of the pallet beneath the insert.

8. The method of claim 1 wherein the pallet is formed of aluminum and the insert is formed of copper.

9. The method of claim 8 wherein the aluminum pallet and the copper insert are plated.

10. The method of claim 1 wherein the coefficient of thermal expansion (CTE) of the device is within about 10 percent of the CTE of the insert.

11. The method of claim 1 wherein the steps of mounting the insert in a cavity on a pallet, positioning the device above the at least one standoff provided in the pocket of the insert, soldering the device leads to the soldering pads, and soldering the casing of the device to the pocket of the insert are automated.

12. The method of claim 1 wherein the device is a transistor.

13. A method for fabricating a printed wiring board (PWB) assembly comprising the steps of:

mounting an insert in a cavity on a pallet, the insert having a pocket including at least one standoff for supporting a device above a bottom surface of the pocket;

coupling a top surface of the insert to a bottom surface of a PWB;

coupling a top surface of the pallet to the bottom surface of the PWB;

placing a solder preform in the pocket of the insert;

positioning the device above the at least one standoff, the device having tinned leads and a tinned casing;

soldering the device leads to soldering pads on a PWB; and soldering the casing of the device to the pocket of the insert.

14. The method of claim 13 wherein the steps of soldering the device leads to soldering pads, and soldering the casing of the device to the pocket of the insert are automated.

15. The method of claim 13 wherein the steps of soldering the device leads to soldering pads, and soldering the casing of the device to the pocket of the insert are performed simultaneously.

16. The method of claim 13 wherein the step of soldering the casing of the device to the pocket of the insert comprises heating the PWB assembly to at least a temperature necessary to reflow the solder preform.

17. The method of claim 13 wherein the solder preform includes cutouts that are complementary to the at least one standoff, and the at least one standoff projects through the cutouts when the solder preform is positioned in the pocket of the insert.

18. The method of claim 13 further comprising the step of placing a thermal pad in the cavity of the pallet beneath the insert.

19. The method of claim 13 wherein the pallet is formed of aluminum and the insert is formed of copper.

20. The method of claim 13 wherein the aluminum pallet and the copper insert are plated.

21. The method of claim 13 wherein the device has a coefficient of thermal expansion (CTE) that is within about 10 percent of the CTE of the insert.

22. The method of claim 13 wherein the steps of mounting the insert in a cavity of a pallet, positioning the device above the at least one standoff provided in the pocket of the insert, soldering the device leads to the soldering pads, and soldering the casing of the device to the pocket of the insert are automated.

23. The method of claim 13 wherein the device is a transistor.

* * * * *